US010401461B2

(12) United States Patent
Chen et al.

(10) Patent No.: US 10,401,461 B2
(45) Date of Patent: Sep. 3, 2019

(54) PARALLEL MULTI-SLICE MR IMAGING WITH SUPPRESSION OF SIDE BAND ARTEFACTS

(71) Applicant: KONINKLIJKE PHILIPS N.V., Eindhoven (NL)

(72) Inventors: Zhaolin Chen, Eindhoven (NL); Miha Fuderer, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 113 days.

(21) Appl. No.: 15/544,899

(22) PCT Filed: Jan. 25, 2016

(86) PCT No.: PCT/EP2016/051395
§ 371 (c)(1),
(2) Date: Jul. 20, 2017

(87) PCT Pub. No.: WO2016/120178
PCT Pub. Date: Aug. 4, 2016

(65) Prior Publication Data
US 2018/0017653 A1 Jan. 18, 2018

(30) Foreign Application Priority Data

Jan. 27, 2015 (EP) .................................... 15152589

(51) Int. Cl.
*G01V 3/00* (2006.01)
*G01R 33/565* (2006.01)
(Continued)

(52) U.S. Cl.
CPC ... *G01R 33/56554* (2013.01); *G01R 33/4835* (2013.01); *G01R 33/56* (2013.01);
(Continued)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS 6,104,191 A * 8/2000 Hurd .................... G01R 33/483
324/307
8,184,879 B2 5/2012 Geier et al.
(Continued)

FOREIGN PATENT DOCUMENTS

WO 2014141055 A1 9/2014

OTHER PUBLICATIONS

Larkman D J et al: "Use of Multicoil Arrays for Separation of Signal from Multiple Slices Simultaneously Excited", Journal of Magnetic Resonance Imaging, Society for Magnetic Resonance Imaging, Oak Brook, IL, US, vol. 13, No. 2, Jan. 1, 2001 (Jan. 1, 2001), pp. 313-317.

(Continued)

*Primary Examiner* — Walter L Lindsay, Jr.
*Assistant Examiner* — Frederick Wenderoth

(57) ABSTRACT

An object (10) placed in an examination volume of a MR device (1) is subject to an imaging sequence including multi-slice RF pulses for simultaneously exciting two or more spatially separate image slices. MR signals are received in parallel via a set of RF coils (11, 12, 13) having different spatial sensitivity profiles within the examination volume. An MR image is reconstructed for each image slice from the acquired MR signals. MR signal contributions from the different image slices are separated on the basis of the spatial sensitivity profiles of the RF coils (11, 12, 13). Side-band artifacts, namely MR signal contributions from regions excited by one or more side-bands of the multi-slice RF pulses, are suppressed in the reconstructed MR images
(Continued)

on the basis of the spatial sensitivity profiles of the RF coils (11, 12, 13).

20 Claims, 2 Drawing Sheets

(51) Int. Cl.
  *G01R 33/483* (2006.01)
  *G01R 33/56* (2006.01)
  *G01R 33/561* (2006.01)
(52) U.S. Cl.
  CPC ....... *G01R 33/565* (2013.01); *G01R 33/5608* (2013.01); *G01R 33/5611* (2013.01)
(58) Field of Classification Search
  USPC .......................................................... 324/309
  See application file for complete search history.

(56) References Cited

U.S. PATENT DOCUMENTS

| | | | |
|---|---|---|---|
| 2006/0049829 | A1 | 3/2006 | Takizawa et al. |
| 2006/0186941 | A1 | 8/2006 | Pruessmann et al. |
| 2008/0180099 | A1 | 7/2008 | Fautz et al. |
| 2009/0161932 | A1* | 6/2009 | Chen .................. G06T 11/006 382/131 |
| 2009/0285463 | A1 | 11/2009 | Otazo et al. |
| 2011/0254548 | A1* | 10/2011 | Setsompop ........ G01R 33/4835 324/309 |
| 2012/0223706 | A1* | 9/2012 | Hetherington ... G01R 33/34007 324/307 |
| 2012/0223709 | A1* | 9/2012 | Schillak ............ G01R 33/3607 324/309 |
| 2013/0043867 | A1 | 2/2013 | Corum et al. |
| 2013/0099784 | A1 | 4/2013 | Setsompop et al. |
| 2013/0249553 | A1 | 9/2013 | Simonetti et al. |
| 2014/0009156 | A1 | 1/2014 | Doneva |
| 2014/0132261 | A1 | 5/2014 | Kim et al. |
| 2014/0132264 | A1 | 5/2014 | Kim et al. |
| 2014/0218026 | A1 | 8/2014 | Moeller et al. |
| 2014/0376794 | A1* | 12/2014 | Dunnoulin ......... G01R 33/5611 382/131 |

OTHER PUBLICATIONS

Breuer, Felix A., et al. Controlled aliasing in parallel imaging results in higher acceleration (CAIPIRINHA) for multi-slice imaging. Magnetic resonance in medicine 53.3 (2005): 684-691.

Kangrong Zhu et al: "Autocalibrating CAIPIRINHA: Reformulating CAIPIRINHA as a 3D Problem", Proceedings of the International Society for Magnetic Resonance in Medicine, 20th Annual Meeting and Exhibition, Melbourne, Australia, May 5-11, 2012,vol. 20, Apr. 21, 2012 (Apr. 21, 2012), p. 518.

Matthias Honal Ft Al: "Increasing efficiency of parallel imaging for 2D multislice acquisitions".Magnetic Resonance in Medicine,vol. 61, No. 6, Apr. 13, 2009 (Apr. 13, 2009), pp. 1459-1470.

Zhao et al "Reduction of Artifacts by Optimization of the Sensitivity Map in Sensitivity-Encoded Spectroscopic Imaging" Magnetic Resonance in Med. , vol. 53, pp. 30-34 (2005).

* cited by examiner

PARALLEL MULTI-SLICE MR IMAGING WITH SUPPRESSION OF SIDE BAND ARTEFACTS

CROSS REFERENCE TO RELATED APPLICATIONS

This application is a U.S. national phase application of International Application No. PCT/EP2016/051395, filed on Jan. 25, 2016, which claims the benefit of EP Application Serial No. 15152589.6 filed on Jan. 27, 2015 and is incorporated herein by reference.

FIELD OF THE INVENTION

The invention relates to the field of magnetic resonance (MR) imaging. It concerns a method of MR imaging of an object. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field ($B_0$ field) whose direction at the same time defines an axis (normally the z-axis) of the co-ordinate system on which the measurement is based. The magnetic field produces different energy levels for the individual nuclear spins in dependence on the magnetic field strength. Transitions between these energy levels can be excited (spin resonance) by application of an electromagnetic alternating field (RF field, also referred to as $B_1$ field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse.

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of one or more receiving RF coils which are arranged and oriented within an examination volume of the MR device in such a manner that the variation of the magnetization is measured in the direction perpendicular to the z-axis.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The MR signal data obtained via the RF coils corresponds to the spatial frequency domain and is called k-space data. A set of k-space data is converted to a MR image by means of Fourier transformation or other appropriate reconstruction algorithms.

Parallel acquisition techniques for accelerating MR acquisition are known in the art since many years. Methods in this category are SENSE (Sensitivity Encoding), SMASH (Simultaneous Acquisition of Spatial Harmonics), and GRAPPA (Generalized Auto-calibrating Partially Parallel Acquisition). SENSE, SMASH, and GRAPPA and other parallel acquisition techniques use undersampled k-space data acquisition obtained from multiple RF receiving coils in parallel. In these methods, the (complex) signal data from the multiple coils are combined with complex weightings in such a way as to suppress undersampling artefacts (aliasing) in the finally reconstructed MR images. This type of complex array signal combination is sometimes referred to as spatial filtering, and includes combining which is performed in the k-space domain (as in SMASH and GRAPPA) or in the image domain (as in SENSE), as well as methods which are hybrids.

Larkman et al. (Journal of Magnetic Resonance Imaging, 13, 313-317, 2001) propose to apply sensitivity encoding also in the slice direction in case of multi-slice imaging to increase scan efficiency. Breuer et al. (Magnetic Resonance in Medicine, 53, 684-691, 2005) improve this basic idea proposing an approach termed "controlled aliasing in parallel imaging results in higher acceleration" (CAIPIRINHA). This technique modifies the appearance of aliasing artefacts in each individual slice during the multi-slice acquisition improving the subsequent parallel image reconstruction procedure. Thus, CAIPIRINHA is a parallel multi-slice imaging technique which is more efficient compared to other multi-slice parallel imaging concepts that use only a pure post-processing approach. In CAIPIRINHA, multiple slices of arbitrary thickness and distance are excited simultaneously with the use of phase-modulated multi-slice RF pulses. The acquired MR signal data are simultaneously sampled, yielding superimposed slice images that appear shifted with respect to each other. The shift of the aliased slice images is controlled by the phase-modulation scheme of the RF pulses in accordance with the Fourier shift theorem. From phase-encoding step to phase-encoding step, the multi-slice RF pulses apply an individual phase shift to the MR signals of each slice. The numerical conditioning of the inverse reconstruction problem, separating the individual signal contributions of the involved slices, is improved by using this shift. CAIPIRINHA has the potential to improve the separation of the superimposed slice images also in cases in which the slices are rather close to each other such that the coil sensitivities of the used RF receiving coils do not differ dramatically in the individual slices to be imaged.

However, the conventional parallel multi-slice imaging approaches have limitations. When MR signals at multiple frequencies are simultaneously excited by a multi-slice (or multi-frequency) RF pulse, so-called side-band artefacts occur in the reconstructed images. These artefacts are caused by MR signals from regions excited unintentionally by one or more side-bands of the multi-slice RF pulse. The side-band frequencies may be higher order harmonics of the fundamental (main-band) frequency of the respective RF pulse. Such side-bands of the multi-slice RF pulse are unavoidable in practice due to hardware constraints of the used MR apparatus, e.g. non-linearity or the RF amplifier.

The characteristics of the side-band artefact depends on the individual load of the RF coil arrangement, the $B_1$ distribution within the examination volume, and the fundamental frequencies involved in the multi-band excitation.

SUMMARY OF THE INVENTION

From the foregoing it is readily appreciated that there is a need for an improved parallel multi-slice MR imaging technique. It is an object of the invention to enable multi-slice MR imaging with efficient suppression of side-band artefacts.

In accordance with the invention, a method of MR imaging of an object placed in an examination volume of a MR device is disclosed. The method comprises the steps of:

subjecting the object to an imaging sequence comprising multi-slice RF pulses for simultaneously exciting two or more spatially separate image slices, acquiring MR signals, wherein the MR signals are received in parallel via a set of RF coils having different spatial sensitivity profiles within the examination volume, and reconstructing a MR image for each image slice from the acquired MR signals, wherein MR signal contributions from the different image slices are separated on the basis of the spatial sensitivity profiles of the RF coils, and wherein side-band artefacts, namely MR signal contributions from regions excited by one or more side-bands of the multi-slice RF pulses, are suppressed in the reconstructed MR images on the basis of the spatial sensitivity profiles of the RF coils.

It is the gist of the invention to suppress side-band artefacts in the finally reconstructed slice images purely by using a parallel image reconstruction algorithm (like the known SENSE algorithm, for example). To this end, MR signal contributions from the image slices are separated from the side-band artefacts according to the invention without taking any prior information about the excitation spectra of the multi-slice RF pulses into account. In other words, the invention does not require to know or to make any assumptions with regard to the details of the side-band spectra of the used RF pulses (such as the amplitudes of the side-band components in relation to the main-band frequency) in order to be able to reconstruct MR images that are essentially free from side-band artefacts. The only assumption that needs to be made relates to the location of the regions excited by the side-bands of the multi-slice RF pulses. These are the locations where the side-band frequencies (typically the higher order harmonics of the fundamental frequency of the respective RF pulse) are in resonance in the presence of the respectively applied slice-selection magnetic field gradient. The suppression achieved by the invention is not very sensitive to an exact a priori location of the side-band artefacts. It appears that in a iterative approach only a few iterations are needed to achieve convergence. The unfolding of the side-band artefacts involves an internal consistency that causes iterative convergence to separation of the actual side-band contributions at their proper locations. This unfolding makes use of the MR signal contributions of the image slices are dominant over the side-band signal contributions.

In a preferred embodiment of the invention, the MR signal contributions from the image slices are separated from the side-band artefacts by using a signal model of the acquired MR signals, which signal model comprises signal contributions from (i) the image slices and (ii) regions outside the image slices that are (potentially) excited by the one or more side-bands of the multi-slice RF pulses. In a possible embodiment, a parameter of the signal model may be the ratio of these two signal contributions which will generally by significantly smaller than 1 since it can be assumed that the side-band energy of the multi-slice RF pulses is much smaller than their main-band energy. The side-band artefacts, i.e. the MR signal contributions from the regions outside the image slices, can be reconstructed (and thereby suppressed/subtracted in the finally reconstructed MR images) by solving a set of linear equations, like, for example, in the conventional SENSE reconstruction scheme, wherein the ratio of the two signal contributions is iteratively adjusted. In practical cases, 2-5 iterations will be sufficient to achieve convergence. Only coarse characteristics of the spectrum may be needed to model acquired magnetic resonance signal. This model includes the ratio of main and side-band contribution, at least as an initial parameter that can be determined automatically in the iterative approach.

In a preferred embodiment of the invention, the multi-slice RF pulses are phase-modulated, wherein the phase modulation scheme comprises a varying phase shift, such that a phase cycle is applied to the MR signals of each image slice. In this way, the technique of the invention is combined with the known CAIPIRINHA scheme (see above). Preferably, the phase shift is linearly incremented from phase-encoding step to phase-encoding step, with an individual phase increment being applied to each image slice. In this way, the individual shift of each slice image is controlled by the phase-modulation scheme of the RF pulses in accordance with the Fourier shift theorem.

In accordance with a further preferred embodiment of the invention, the MR signals are acquired with undersampling in the in-plane direction of the image slices. The MR images of the image slices can be reconstructed in this case by per se known parallel image reconstruction algorithms, like SENSE, SMASH or GRAPPA.

The method of the invention described thus far can be carried out by means of a MR device including at least one main magnet coil for generating a uniform static magnetic field within an examination volume, a number of gradient coils for generating switched magnetic field gradients in different spatial directions within the examination volume, a set of RF coils for receiving MR signals from the body in parallel, the RF coils having different spatial sensitivity profiles, a control unit for controlling the temporal succession of RF pulses and switched magnetic field gradients, and a reconstruction unit. The method of the invention can be implemented, for example, by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings:

FIG. 2a shows a MR slice image acquired using a conventional multi-slice acquisition scheme;

FIG. 2b shows a MR slice image with suppression of side-band artefacts according to the invention;

FIG. 2c shows the contribution of side-band artefacts to the MR slice image of FIG. 2a.

DETAILED DESCRIPTION OF THE EMBODIMENTS

Figure 1:
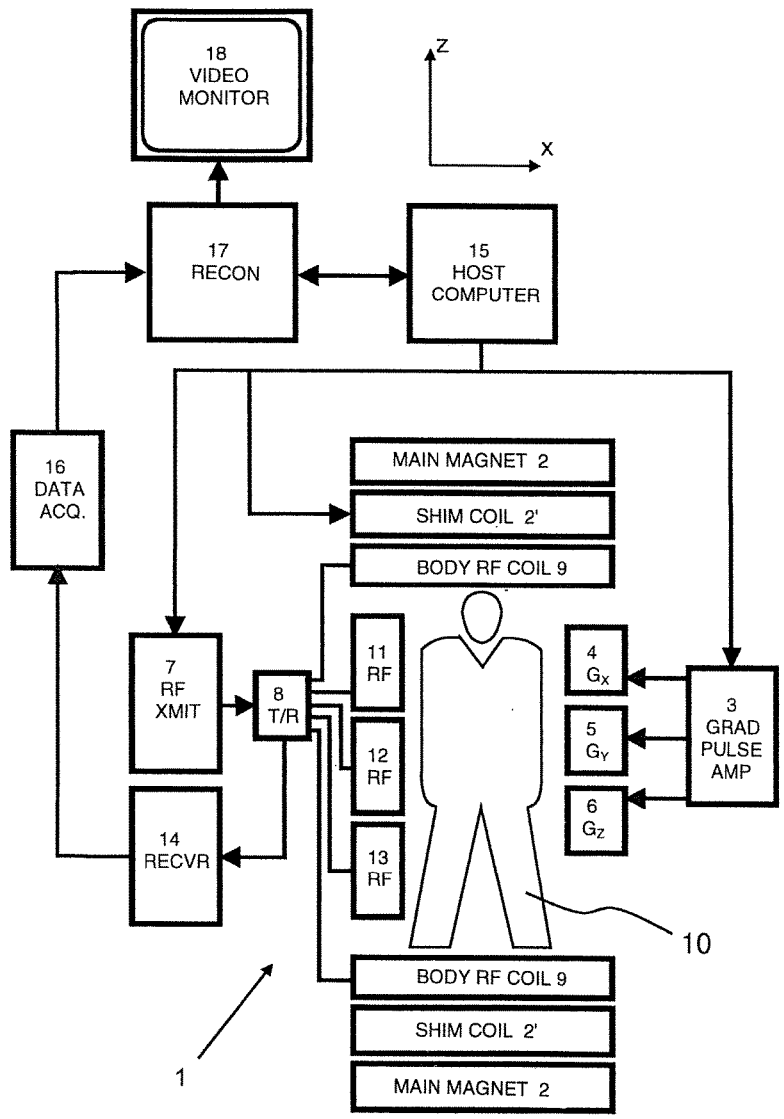
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume.

For generation of MR images of limited regions of the body 10 by means of parallel imaging, a set of local RF coils 11, 12, 13 are placed contiguous to the region selected for imaging.

The resultant MR signals are picked up by the RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analogue-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 2:
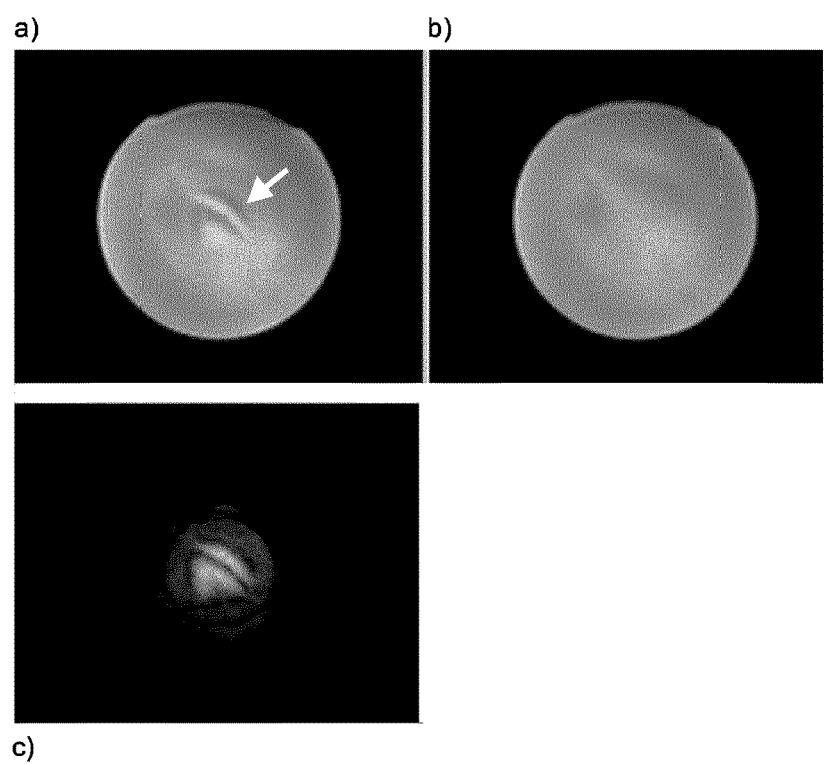

With continuing reference to FIG. 1 and with further reference to FIG. 2 an embodiment of the imaging approach of the invention is explained.

According to the invention, the body 10 of the patient is subjected to an imaging sequence comprising multi-slice RF pulses by which nuclear spins within two or more spatially separate image slices are excited simultaneously. The MR signals generated by the imaging sequence are acquired in parallel via the RF coils 11, 12, 13 having different spatial sensitivity profiles. Like in conventional multi-slice techniques, a MR image is reconstructed for each image slice from the acquired MR signals, wherein the MR signal contributions from the different image slices are separated on the basis of the (known) spatial sensitivity profiles of the RF coils 11, 12, 13. The algorithm applied for separation of the image slices, which actually corresponds to the conventional SENSE unfolding algorithm, is described in more detail in the following:

At first, we consider, over the N different image slices, all image locations $x_i$ that contribute to one location x in the acquired MR signal m of each of the M receive coils. This can be written in matrix vector notation as:

$$Sp=m$$

Therein the vector m denotes the acquired MR signals $m_j(x)$ in each of the M RF coils 11, 12, 13 as a linear combination of the sensitivity-weighted signal contributions $p_i(x_i)$ of the N different image slices, whereas matrix S denotes the (N×M) sensitivity matrix with $S_{ij}$ being the coil sensitivity for coil j and slice I at position $x_i$. Solving this system of equations including inversion of the encoding matrix yields the vector p, which contains the corresponding N slice specific MR signals:

$$(S^H S)^{-1} S^H m = p$$

The matrix $(S^H S)^{-1} S^H$ is the pseudo-inverse of S and its norm describes the error propagation from the MR signal acquisitions into the final image. This norm is small in case of a good conditioning.

According to the invention, side-band artefacts, namely MR signal contributions from regions excited by one or more side-bands of the multi-slice RF pulses, are suppressed in the reconstructed MR images on the basis of the spatial sensitivity profiles of the RF coils 11, 12, 13. In order to achieve this, a signal model is employed comprising the vector p, which contains the N slice specific main-band MR signal contributions at locations $x_i$, and additionally a vector p', which contains L side-band MR signal contributions, i.e. MR signal contributions from regions outside the image slices that are potentially excited by the side-band frequency components of the multi-slice RF pulses. With this model, the acquired MR signals via each of the M receive coils can be written matrix as:

$$S \begin{pmatrix} p \\ p' \end{pmatrix} = m$$

Therein matrix S denotes the (N+L)×M sensitivity matrix with $S_{ij}$ being the coil sensitivity for coil j and main-band contributions (i=1 . . . N) and side-band contributions (i=N+1 . . . N+L). This system of equations can be solved by using the principally known regularized SENSE framework:

$$\begin{pmatrix} p \\ p' \end{pmatrix} = \left( S^H S + \begin{bmatrix} I & 0 \\ 0 & \sigma^{-1} \end{bmatrix} \begin{bmatrix} R^{-1} & 0 \\ 0 & R'^{-1} \end{bmatrix} \begin{bmatrix} I & 0 \\ 0 & \sigma^{-1} \end{bmatrix} \right) S^H m$$

Therein R/R' is the regularization matrix and σ represents the ratio of the main-band and side-band contributions, with $$\sigma = \begin{bmatrix} \sigma & \cdots & 0 \\ \vdots & \ddots & \vdots \\ 0 & \cdots & \sigma \end{bmatrix}$$

The parameter σ can be obtained as a user parameter or it can be determined automatically by iteratively solving the above equation, wherein σ is updated as:

$$\sigma = \text{average}(p\sqrt{R'})/\text{average}(p\sqrt{R})$$

Therein "average" is to be understood an average over all image voxels or over image voxels within a predetermined region around a given position. Convergence should be achieved in practice after a small number of 2-5 iterations. In a more general model, the parameter σ may be different for each side band, such that a parameter set $\sigma_1, \sigma_2, \ldots \sigma_L$ could be applied. The solution of the vector p represents the N MR slice images that are free from side-band artefacts.

This is illustrated in FIG. 2. FIG. 2a shows a MR slice image reconstructed in the conventional fashion from MR signal data acquired from a phantom in parallel via a set of RF coils using multi-slice excitation. The white arrow indicates strong side-band artefacts in the centre of the MR image. FIG. 2b shows a MR slice image reconstructed from the same MR signal data using the above-described modified SENSE framework for suppressing the side-band artefacts according to the invention. As can be seen, the side-band artefacts are more or less completely eliminated in FIG. 2b. FIG. 2c shows the side-band artefacts (p') separated from the main-band signals (p) using the above framework.

In an embodiment of the invention, SENSE may be additionally applied in the in-plane phase-encoding direction using an appropriate reduction factor.

The invention claimed is:

1. A method of magnetic resonance (MR) imaging of an object placed in an examination volume of a MR device, the method comprising:

subjecting the object to an imaging sequence comprising multi-slice RF pulses for simultaneously exciting two or more spatially separate image slices, acquiring MR signals, wherein the MR signals are received in parallel via a set of RF coils having different spatial sensitivity profiles within the examination volume, and reconstructing a MR image for each of the two or more image slices from the acquired MR signals, wherein MR signal contributions from the two or more image slices are separated on the basis of the spatial sensitivity profiles of the RF coils, and wherein the MR signal contributions from the two or more image slices are separated from the side-band artifacts, namely MR signal contributions from regions excited by one or more side-bands of the multi-slice RF pulses, wherein the MR signal contributions from the image slices are separated from the side-band artifacts by using a signal model of the acquired MR signals, which signal model includes signal contributions from (i) the image slices and (ii) regions excited by the one or more side-bands of the multi-slice RF pulses, wherein the side-band artifacts are determined by solving a set of linear equations including iteratively adjusting relative signal contributions from (i) and (ii) of the acquired signals, and wherein the separated side-band artifacts are suppressed in the reconstructed MR images on the basis of the spatial sensitivity profiles of the RF coils.

2. A non-transitory computer-readable medium carrying instructions configured to be run on a magnetic resonance (MR) device to control the MR device to:

generate an imaging sequence comprising multi-slice RF pulses for simultaneously exciting two or more spatially separate image slices, acquire MR signals, and reconstruct an MR image for each image slice from the acquired MR signals, wherein MR signal contributions from the different image slices are separated on the basis of the spatial sensitivity profiles of a set of RF coils, and wherein the MR signal contributions from the image slices are separated from the side-band artifacts, namely MR signal contributions from regions excited by one or more side-bands of the multi-slice RF pulses, wherein the regions excited by the side-bands of the multi-slice RF pulses are regions where the side-band frequencies, namely the higher order harmonics of the fundamental frequency of the multi-slice RF pulses, are in resonance in the presence of a slice-selection magnetic field gradient of the imaging sequence and the separated side-band artifacts, namely MR signal contributions from regions excited by one or more side-bands of the multi-slice RF pulses, are suppressed in the reconstructed MR images on the basis of the spatial sensitivity profiles of the RF coils.

3. A magnetic resonance imaging (MRI) device comprising:

at least one main magnet coil configured to generate a static magnetic field within an examination volume;

a plurality of gradient coils configured to generate switched magnetic field gradients in a plurality of spatial directions within the examination volume;

a set of radio frequency (RF) coils having different spatial sensitivity profiles;

a controller configured to control the gradient coils and the set of RF coils to generate succession of multi-slice RF pulses and switched magnetic field gradients in a subject in the examination volume to simultaneously excite two or more spatially separate slices images with multi-slice RF pulses and receive MR signals in parallel with the set of RF coils from the subject in the examination volume; and a reconstruction processor configured to reconstruct an MR image for each of the separate image slices from the received MR signals including:

separating MR signal contributions from the plurality of image slices on the basis of the spatial sensitivity profiles of the set of RF coils, separating MR signal contributions from regions excited by one or more side-bands of the multi-slice RF pulses, wherein the MR signal contributions from the regions excited by the one or more side bands include higher order harmonics of a fundamental frequency of the multi-slice RF pulses which are in resonance in the presence of a slice-selection magnetic field gradient of the imaging sequence, suppressing separate side-band artifacts from the regions excited by the one or more sidebands in the reconstructed MR images using the spatial sensitivity profiles of the RF coils.

4. The method of claim 1, wherein the MR signal contributions from the image slices are separated from the side-band artifacts without taking prior information about the excitation spectra of the multi-slice RF pulses into account.

5. The method of claim 1, wherein determining the relative signal contributions includes determining a ratio.

6. The method of claim 1, wherein the regions excited by the side-bands of the multi-slice RF pulses are the locations where the side-band frequencies, namely the higher order harmonics of the fundamental frequency of the multi-slice RF pulses, are in resonance in the presence of a slice-selection magnetic field gradient of the imaging sequence.

7. The method of claim 1, wherein the multi-slice RF pulses are phase-modulated, wherein the phase-modulation comprises a varying phase shift, such that a phase cycle is applied to the MR signals of each image slice.

8. The method of claim 7, wherein the phase shift is linearly incremented from phase-encoding step to phase-encoding step.

9. The method of claim 1, wherein the MR signals are acquired with undersampling in the in-plane direction of the image slices, wherein the MR images are reconstructed using a parallel image reconstruction algorithm, like SENSE, SMASH or GRAPPA.

10. A magnetic resonance (MR) device for carrying out the method claimed in claim 6, wherein the MR device includes at least one main magnet coil for generating a uniform, static magnetic field within an examination volume, a number of gradient coils for generating switched magnetic field gradients in different spatial directions within the examination volume, a set of RF coils having different spatial sensitivity profiles, a control unit for controlling the temporal succession of RF pulses and switched magnetic field gradients, and a reconstruction unit, wherein the MR device is arranged to perform the following steps:
subjecting the object to an imaging sequence comprising multi-slice RF pulses for simultaneously exciting two or more spatially separate image slices,
acquiring MR signals, wherein the MR signals are received in parallel via a set of RF coils having different spatial sensitivity profiles within the examination volume, and
reconstructing a MR image for each image slice from the acquired MR signals, wherein MR signal contributions from the different image slices are separated on the basis of the spatial sensitivity profiles of the RF coils, and the MR signal contributions from the image slices are separated from the side-band artifacts, namely MR signal contributions from regions excited by one or more side-bands of the multi-slice RF pulses, wherein the regions excited by the side-bands of the multi-slice RF pulses are the regions where the side-band frequencies, namely the higher order harmonics of the fundamental frequency of the multi-slice RF pulses, are in resonance in the presence of a slice-selection magnetic field gradient of the imaging sequence and the separated side-band artifacts are suppressed in the reconstructed MR images on the basis of the spatial sensitivity profiles of the RF coils.

11. The MR device of claim 10, wherein the MR signal contributions from the image slices are separated from the side-band artifacts without taking prior information about the excitation spectra of the multi-slice RF pulses into account.

12. The MR device of claim 10, wherein the MR signal contributions from the image slices are separated from the side-band artifacts by using a signal model of the acquired MR signals, which signal model comprises signal contributions from (i) the image slices and (ii) regions excited by the one or more side-bands of the multi-slice RF pulses.

13. The MR device of claim 12, wherein the side-band artifacts are determined by solving a set of linear equations, wherein a ratio of signal contributions from (i) the image slices and (ii) the regions excited by the one or more side-bands of the multi-slice RF pulses is iteratively adjusted.

14. The MR device of claim 10, wherein the multi-slice RF pulses are phase-modulated including a varying phase shift, such that a phase cycle is applied to the MR signals of each image slice.

15. The MR device of claim 14, wherein the varying phase shift is linearly incremented from phase-encoding step to phase-encoding step.

16. The MR device of claim 10, wherein the MR signals are acquired with undersampling in the in-plane direction of the image slices, wherein the MR images are reconstructed using a parallel image reconstruction algorithm.

17. The non-transitory computer-readable medium of claim 2, wherein the MR signal contributions from the image slices are separated from the side-band artifacts without taking prior information about the excitation spectra of the multi-slice RF pulses into account.

18. The non-transitory computer-readable medium of claim 17, wherein the MR signal contributions from the image slices are separated from the side-band artifacts by using a signal model of the acquired MR signals, which signal model comprises signal contributions from (i) the image slices and (ii) regions excited by the one or more side-bands of the multi-slice RF pulses.

19. The non-transitory computer-readable medium of claim 18, wherein the side-band artifacts are determined by solving a set of linear equations, wherein a ratio of the signal contributions (i) and (ii) to the acquired MR signals is iteratively adjusted.

20. The MRI device of claim 3, wherein the reconstruction processor is further configured to:
solve a set of linear equations including iteratively adjusting signal contributions from (i) the image slices and (ii) the regions excited by the one or more side-bands of the acquired MR signals to determine the side-band artifacts, and
separate the MR signal contributions from the image slices from the side-band artifacts using a signal model of the acquired MR signals, which signal model includes signal contributions from (i) the image slices and (ii) the regions excited by the one or more side-bands of the multi-slice RF pulses.

* * * * *